United States Patent
Chen et al.

(10) Patent No.: US 7,332,379 B2
(45) Date of Patent: Feb. 19, 2008

(54) METHOD OF AN ARRAY OF STRUCTURES SENSITIVE TO ESD AND STRUCTURE MADE THEREFROM

(75) Inventors: Jr-Hong Chen, Jhudong Township (TW); Gwo-Long Lin, Hsinchu (TW); Chih-Fang Chen, Chu-Nan Chen (TW)

(73) Assignee: TPO Displays Corp., Chu-Nan (TW)

( * ) Notice: Subject to any disclaimer, the term of this patent is extended or adjusted under 35 U.S.C. 154(b) by 317 days.

(21) Appl. No.: 11/040,747

(22) Filed: Jan. 21, 2005

(65) Prior Publication Data

US 2005/0186715 A1  Aug. 25, 2005

(30) Foreign Application Priority Data

Feb. 23, 2004  (TW)  ............... 93104404 A

(51) Int. Cl.
 *H01L 21/82* (2006.01)
(52) U.S. Cl. .................................... 438/130
(58) Field of Classification Search ......... 438/128–132
See application file for complete search history.

(56) References Cited

U.S. PATENT DOCUMENTS 5,798,534 A * 8/1998 Young ................. 257/59
7,005,707 B2 * 2/2006 Lai ..................... 257/355
2002/0101547 A1  8/2002 Lee et al.
2005/0023614 A1 * 2/2005 Lai ..................... 257/360

FOREIGN PATENT DOCUMENTS

| CN | 1256763 | 6/2000 |
|----|---------|--------|
| CN | 2600837 | 1/2004 |
| JP | 09-105954 | 4/1997 |
| JP | 09-219527 | 8/1997 |
| JP | 2003-156764 | 5/2003 |

* cited by examiner

*Primary Examiner*—Zandra V. Smith
*Assistant Examiner*—Seth Barnes
(74) *Attorney, Agent, or Firm*—Liu & Liu

(57) ABSTRACT

A method of fabricating an array of structures sensitive to ESD is disclosed. First, an array of structures is provided on a substrate, with the structures conductively coupled by interconnections. Thereafter, the interconnections are removed before fabricating another array of structures. Therefore, the structures have equal potential. Further, an electrostatic discharge structure is provided near the periphery of the substrates.

13 Claims, 5 Drawing Sheets

METHOD OF AN ARRAY OF STRUCTURES SENSITIVE TO ESD AND STRUCTURE MADE THEREFROM

CROSS-REFERENCE TO RELATED APPLICATION

This application claims the priority benefit of Taiwan application serial no. 93104404, filed on Feb. 23, 2004.

BACKGROUND OF THE INVENTION

1. Field of the Invention

The present invention relates to a method of fabricating a thin film transistor (TFT) array, and more particularly to a method of fabricating an array of structures sensitive to electrostatic discharge and structure made therefrom.

2. Description of the Related Art

Because of its low operational voltage, non-radiation, small weight and size superior to those of cathode ray tube (CRT), liquid crystal display, plasma display and electroluminance display have been widely studied and developed, and is viewed as the main stream display in the future.

Active matrix liquid crystal display controls data read/write by active element such as transistors or diodes at pixel, for example, TFT liquid crystal display. When the transistor is on, the signal is transmitted to the pixel; whereas when the transistor is off, the capacitor can maintain a potential to drive the liquid crystal. Therefore, the liquid crystal within such driving period is in a static state.

Electrostatic discharge (ESD) is always a big problem with the fabrication of TFT. Electrostatic charges may build up at any time and any place, such as, during the manufacturing, transportation, storage and usage of the digital electronic devices. Should the electrostatic charges discharge onto the TFT, it would cause arcing, release of a surge of energy, and/or a momentary current and/or voltage surge, which could damage the TFT structure. How to resolve the problem of ESD and to enhance the manufacturing yield is important.

SUMMARY OF THE INVENTION

The present invention provides a solution to avoiding damages from ESD during substrate processing. The individual structures formed on the substrate are initially conductively coupled together by interconnections as the structures are being formed. Electrostatic charges built up in the structures on the substrate are discharge automatically before damage can be done. The interconnections between the individual structures are removed before fabricating another array of structures.

The present invention also discloses an array substrate including a substrate and an array of structures formed on the substrate, wherein the structures are initially conductively coupled by interconnections, but the interconnections are removed before the fabrication of another array of structures.

The present invention resolves the problem of electrostatic discharge by improving the fabrication processes. First, independent circuits of a conductive layer are designed to have equal potential. Further, point discharge structures are formed on the edges of the substrate. Therefore, in accordance to the present invention, the prevention from electrostatic discharge is enhanced during the entire manufacturing process. Consequently, the manufacturing yield is improved.

In order to make the aforementioned and other aspects, features and advantages of the present invention understandable, a preferred embodiment accompanied with figures is described in detail below.

BRIEF DESCRIPTION OF THE DRAWINGS

FIG. 3($b$) is a cross-section drawing of portion of the TFT array in FIG. 3($a$).

FIGS. 4($b$) and ($c$) are enlarged schematic drawings of part IV in FIG. 4($a$).

DESCRIPTION OF SOME EMBODIMENTS

Figure 1:
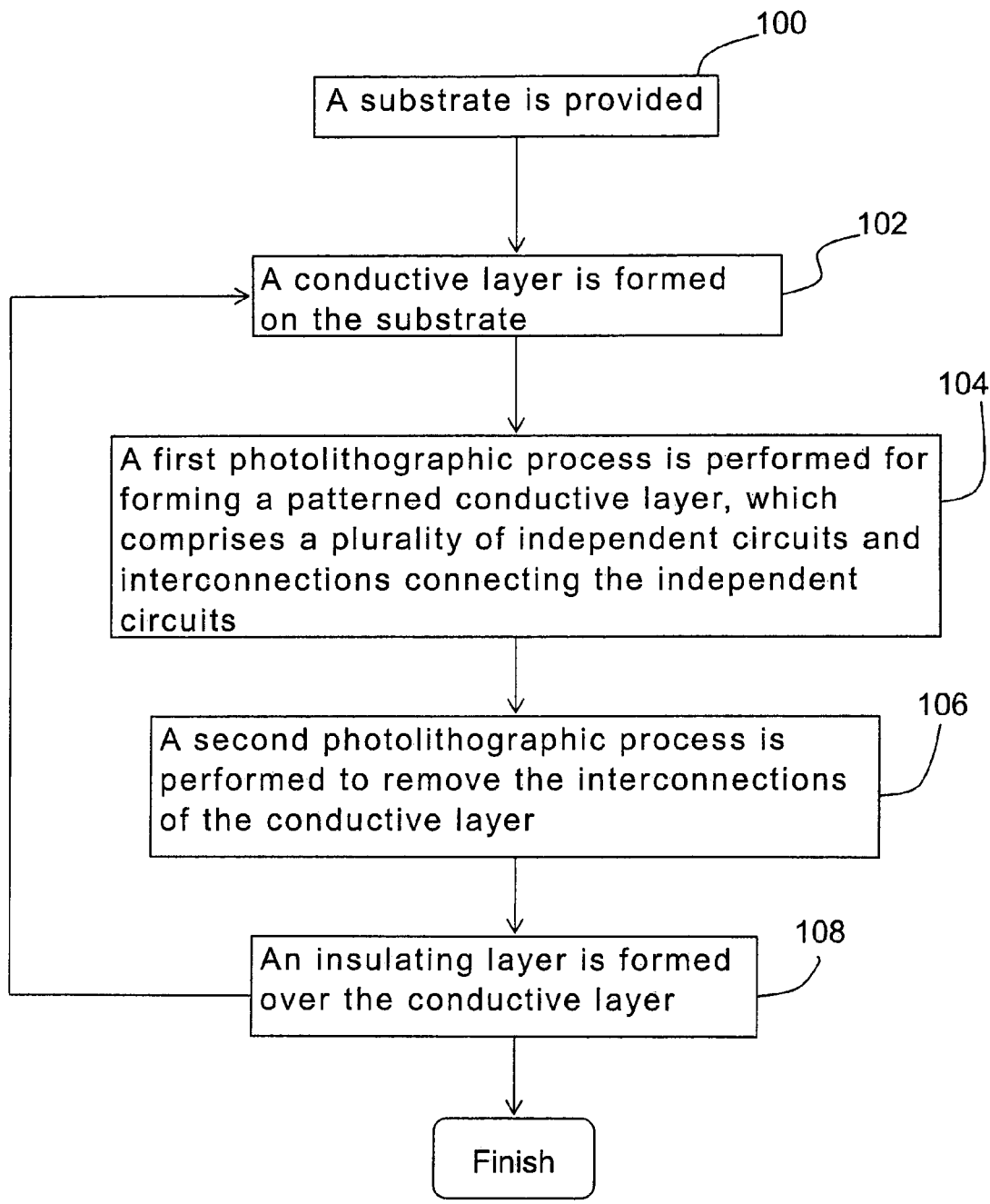
FIG. 1 is a flow chart illustrating the process flow of fabricating an exemplary TFT array in accordance with one embodiment of the present invention.

FIG. 1 is a flow chart illustrating the process flow of fabricating an exemplary TFT array of the present invention. The conductive layer is formed by two photolithographic processes and etching processes. Each photolithographic process includes for example, the steps of photoresist coating, soft bake, hard bake, exposure, fixing, development, and etching to pattern the conductive layer.

Referring to FIG. 1, a substrate is provided in step 100, which is a transparent substrate, such as, a glass substrate or quartz substrate. In step 102, a conductive layer is formed on the substrate.

Figure 2:
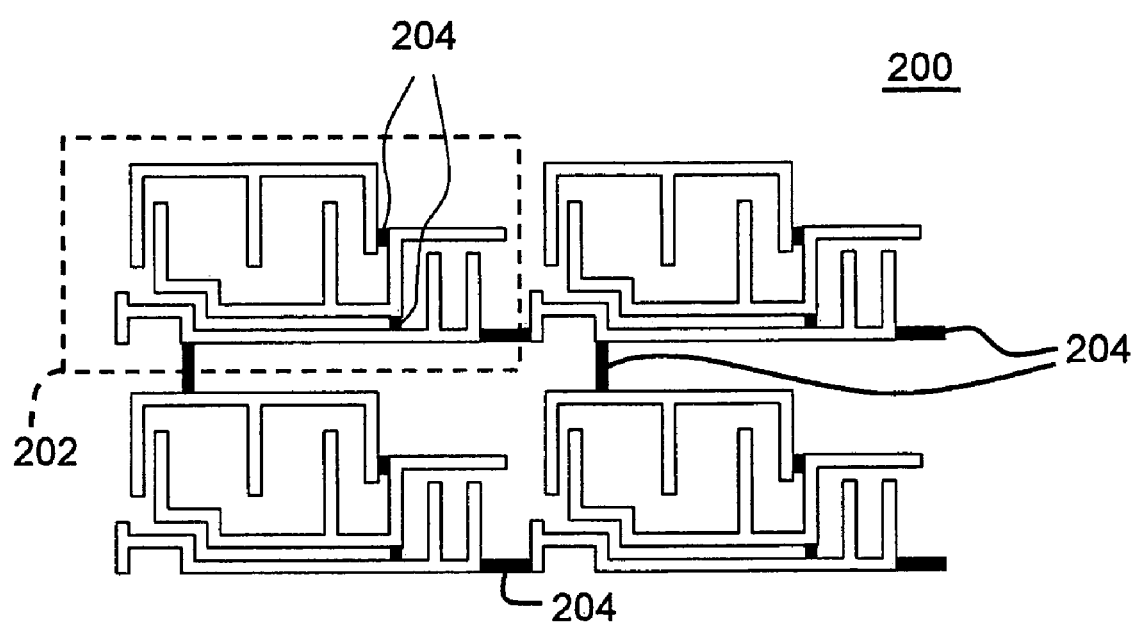
FIG. 2 is a schematic circuit layout generated from the step 104 of the process flow for fabricating the TFT array of FIG. 1.
Figure 4:
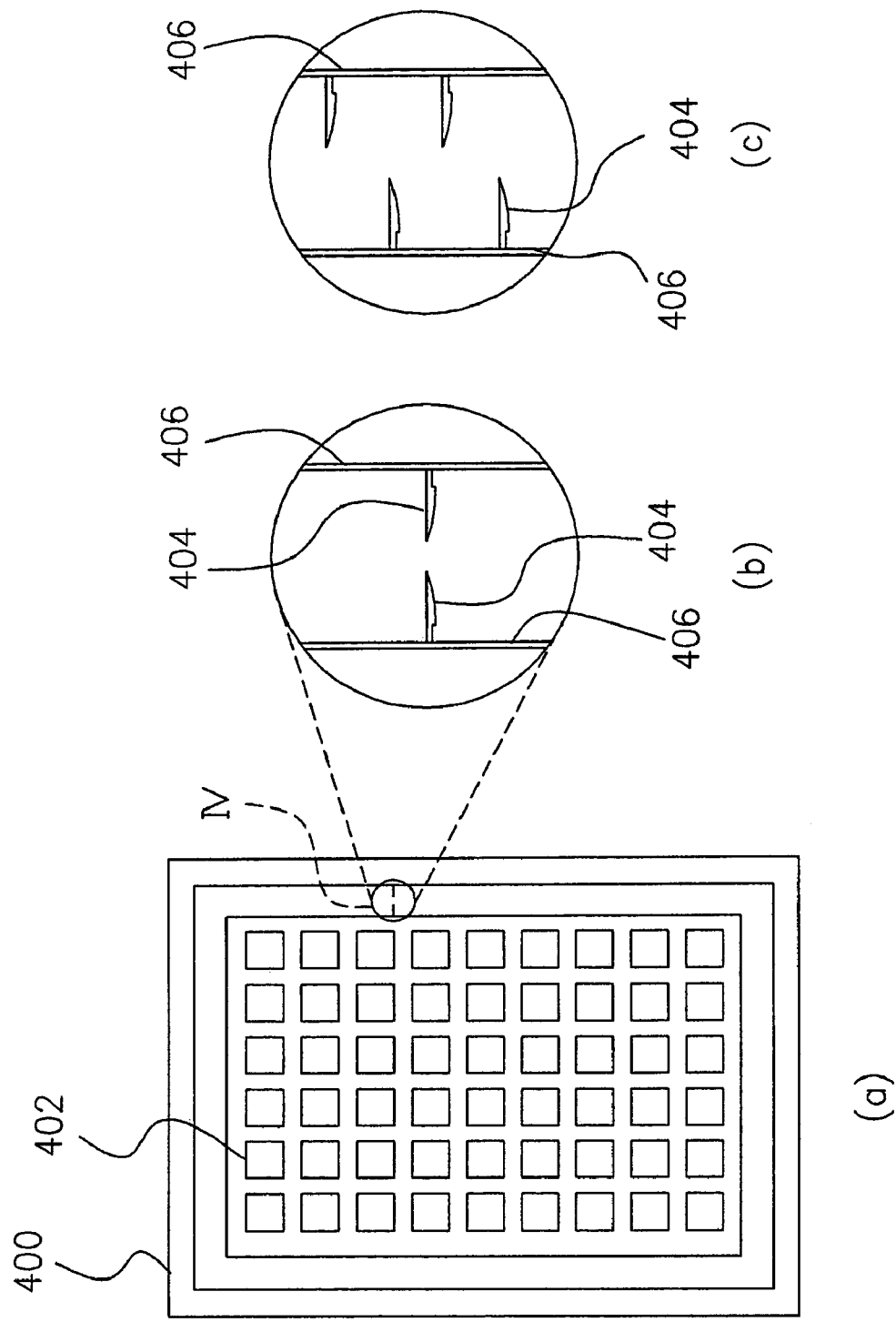
FIG. 4($a$) is a schematic structure showing an exemplary TFT array.

In step 104, a first photolithographic process is performed for forming a patterned conductive layer, which comprises a plurality of independent circuits and interconnections connecting the independent circuits (see also FIG. 2). Furthermore a point discharge structure can be formed on the edge of the substrate simultaneously (see also FIG. 4). The point discharge structure can reduce electric potential of the substrate by sharing out and decreasing the electrostatic potential that is induced and accumulated from environment, without interfering with the main circuits of the TFT array.

Figure 3:
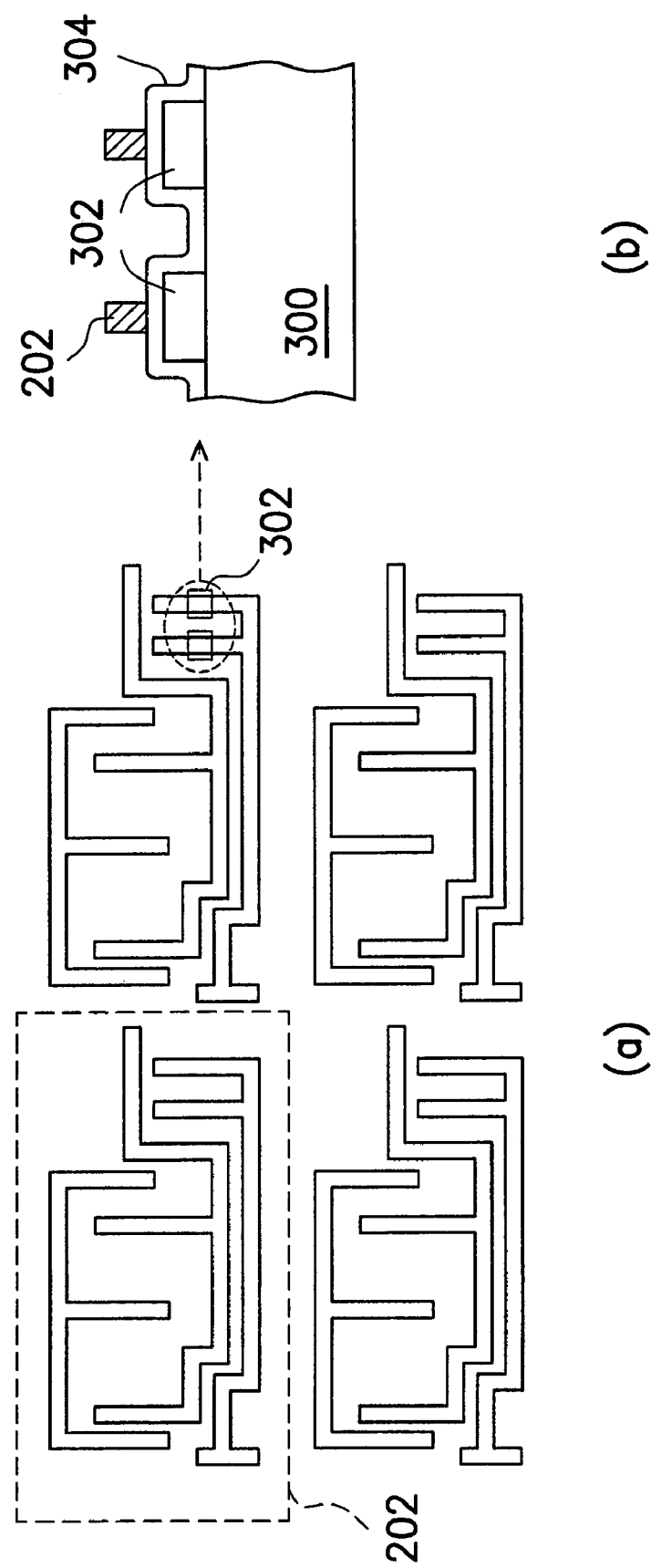
FIG. 3($a$) is a schematic circuit layout generated from the step 106 of the process flow for fabricating the TFT array of FIG. 1.

Referring to FIG. 1, a second photolithographic process is performed to remove the interconnections of the conductive layer in step 106 before forming next conductive layer (see also FIG. 3($a$)). Then, an insulating layer is formed on the conductive layer in step 108, which can be, for example, a dielectric layer. After step 108, the step 102 can be repeated for forming next conductive layer.

When the present invention is applied to the fabrication of a TFT array, the layers formed by lithography processes in FIG. 1 may include a first metal layer (e.g. gate, scan line, etc.) and a second metal layer (source, drain, data line, etc.) Specifically, referring to FIG. 3($b$), several polysilicon islands 302 are formed on a substrate 300 and then an insulating film 304 is provided to cover the polysilicon islands 302. Next, a gate 202 can be formed on each of polysilicon islands 302 in accordance with steps 102~106.

An insulating layer (not shown) is formed over the resulting structure in FIG. 3(b) as a protective layer in step 108.

Then, the steps 102~106 are repeated for the other layers of the TFT. More specifically, in the illustrated embodiment, a second conductive layer is formed over the underlying structure. In a step similar to step 104, the second conductive layer is patterned for forming independent circuits, which comprises source/drain and data lines connected to source/drain, and interconnections connected to the above mentioned independent circuits. In a step similar to step 106, the interconnections of the second conductive layer then are removed. A second insulating layer is formed over the second conductive layer for evenness in step a step similar to 108, wherein the second insulating layer has a plurality of contact holes. Pixel electrodes are formed on the second conductive layer and electrically connect to the source/drain terminals of the second conductive layer through the contact holes.

The difference between the first and the second photolithographic processes is illustrated below.

FIG. 2 and FIG. 3 are schematic circuit layouts generated from the steps 104 and 106 of the process flow for fabricating the TFT array, respectively. Please referring to FIG. 2, it is a pattern 200 of the conductive layer after the first photolithographic process, which comprises independent circuits 202 and interconnections 204 connecting the independent circuits 202. The pattern 200 of the conductive layer is not limited thereto. In addition, it is also desirable that the interconnections 204 and the independent circuits 202 are electrically connected within the pattern 200. Therefore, the two-row independent circuits as shown in FIG. 2 can be connected by one interconnection.

Please referring to FIG. 2, the pattern 200 of the conductive layer formed by the first photolithographic process makes the conductive layer have equal potential. Therefore, there is no local electrostatic discharge and arc phenomenon occur from the high potential difference in the same layer.

Please referring to FIG. 3(a), the interconnections 204 connecting the independent circuits 202 are removed and the independent circuits 202 are remained before forming the second conductive layer.

Following are the descriptions of forming an electrostatic discharge protection structure.

FIG. 4(a) is a schematic diagram showing the structure of an exemplary TFT array. FIGS. 4(b) and (c) are enlarged schematic drawings of part IV in FIG. 4(a). Please referring to FIGS. 4(a)-(c), the electrostatic discharge protection structure of the present invention can be formed at the edge of the substrate 400 in steps 102~104 of forming the patterned conductive layer, which comprises two tips 404, wherein the two tips 404 face or mismatch from each other without connection. In addition, each tip connects to one of two conductive wires that are isolated from each other. The method of fabricating the two tips 404 may includes providing a first tip conductively coupled to the array of structures as shown in FIG. 3(a) and then providing a second tip grounded, wherein electrostatic charges can be discharged from one tip to the other. Because the point discharge structure is formed on the edge of the substrate 400, the electric potential of the substrate 400 is reduced by sharing out and decreasing the electrostatic potential that is induced and accumulated from environment without interfering with the TFT 402.

In the present invention, all conductive layers have equal potential and the electrostatic discharge protection structure is formed on the edge of the substrate. Therefore, there is no partial electrostatic discharge and arc phenomenon occur from the high potential difference in the same layer during follow-up processes. And, electrostatic discharge damage to the conductive layers of the substrate can be eliminated by means of the point discharge structure by sharing out and decreasing the electrostatic potential that is induced and accumulated from environment. Moreover, before forming next conductive layer, the interconnections of the conductive layer are removed and the next conductive layer can follow the same design to prevent electrostatic discharge. Thus, the present invention can cooperate with other devices and processes and is not limited thereto.

Figure 5:
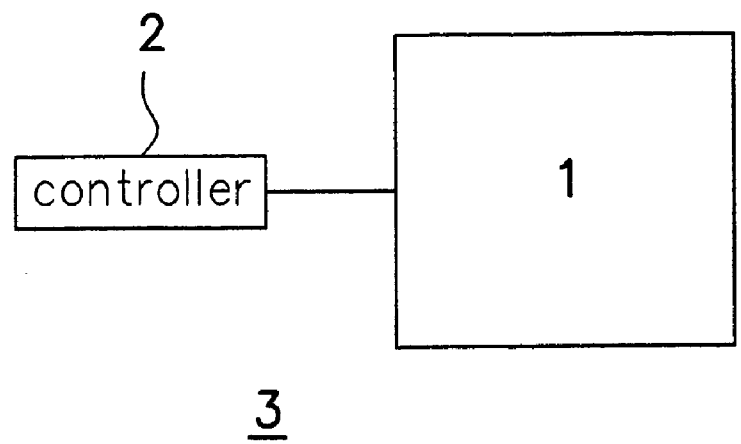
FIG. 5 is a display device that incorporates the TFT array fabricated in accordance with the present invention.

FIG. 5 is a display device that incorporates the TFT array fabricated in accordance with the present invention. Referring to FIG. 5, a display panel 1 is provided and an array of TFT of the display panel 1 is formed in accordance with the steps in FIG. 1. Besides, a controller 2 is connected with the display panel in order to control the display panel.

Figure 6:
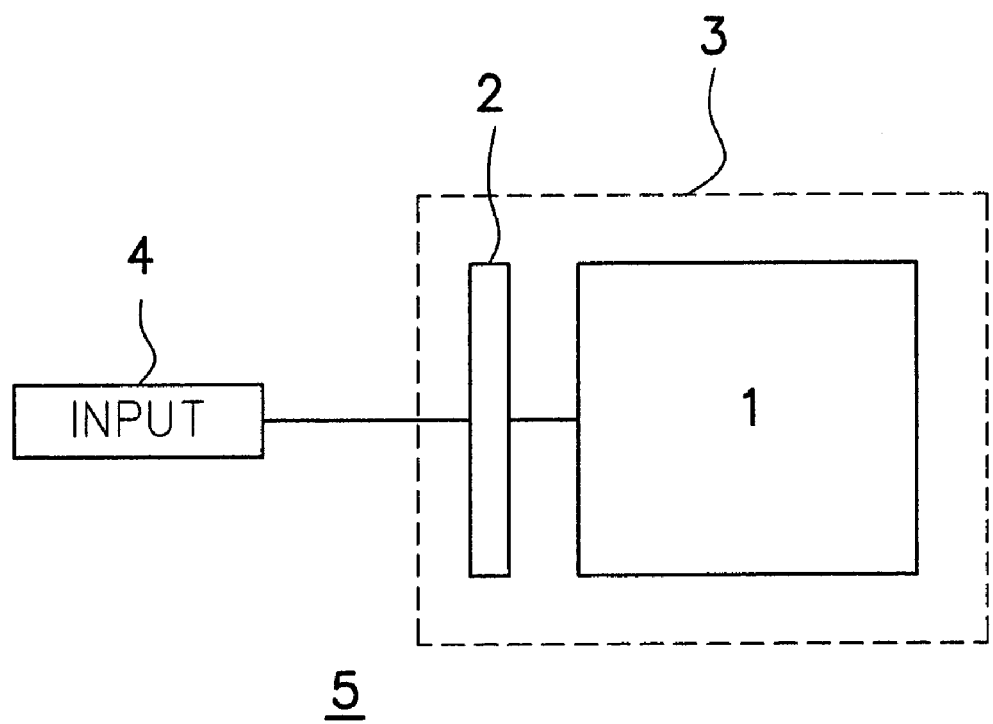
FIG. 6 is an electronic device that incorporates a display device having the TFT array fabricated in accordance with the present invention.

FIG. 6 is an electronic device that incorporates a display device 3 having the TFT array fabricated in accordance with the present invention. Referring to FIG. 6, an input device 4 is coupled to the controller 2 of the display device 3 shown in FIG. 5 can include a processor or the like to input data to the controller 2 to render an image. The electronic device 5 may be a portable device such as a PDA, notebook computer, tablet computer, cell phone or a desktop computer.

Although the present invention has been described in terms of exemplary embodiments, it is not limited thereto. Rather, the appended claims should be constructed broadly to include other variants and embodiments of the invention which may be made by those skilled in the field of this art without restructuring from the scope and range of equivalents of the invention. For example, ESD protection need not be provided for each and every layers shown in FIG. 3. ESD protection in accordance with the present invention may be omitted for those layers in which the structures are less sensitive to ESD. Further, the various conductive layers and/or insulating layers may each comprise more than one type of material or sublayer processes by each step shown in FIG. 1. The actual fabrication process may also include additional initial, intermediate and/or later steps not shown in the flow diagram shown in FIG. 1.

What is claimed is:

1. A method of fabricating on a substrate, an array of structures sensitive to ESD, comprising:
   providing an electrostatic discharge structure near the periphery of the substrate;
   forming the array of structures on the substrate, with the structures being conductively coupled by interconnections in a manner such that the array of structures are at same potential, wherein the array of structures is conductively connected to the electrostatic discharge structure for electrostatic protection without directly connecting each structure in the array of structures to the electrostatic discharge structure; and
   conductively decoupling the array of structures to separate the structures conductively.

2. The method as in claim 1, wherein the array of structures each comprises an individual circuit.

3. The method as in claim 1, wherein the array of structures comprises an array of TFT.

4. The method as in claim 1, wherein the step of providing the electrostatic discharge structure comprises:
   providing a first tip conductively coupled to the array of structures; and
   providing a second tip grounded, wherein electrostatic charges can be discharged from one tip to the other.

5. The method as in claim 4, wherein the first tip and the second tip are facing or mismatching from each other without connection.

6. The method as in claim 1, wherein the step of forming the array of structures on the substrate comprises:
   forming a first conductive layer on the substrate; and
   patterning the first conductive layer to form the array of structures and the interconnections within the first conductive layer.

7. The method as in claim 1, wherein the electrostatic discharge structure is provided by forming the electrostatic discharge structure during the step of forming the array of structures.

8. The method as in claim 6, further comprising:
   forming a second conductive layer above the first conductive layer after the array of structures have been conductively decoupled.

9. The method as in claim 8, wherein the step of forming the second conductive layer includes providing an insulating layer on the first conductive layer prior to forming an array of structures in the second conductive layer.

10. The method of claim 1, wherein the step of conductively decoupling the array of structures includes conductively breaking the interconnections.

11. The method of claim 10, wherein the step of conductively breaking the interconnections includes removing the interconnections.

12. The method of claim 6, wherein the array of structure comprises a plurality of independent circuits, and the interconnections connect the plurality of independent circuits.

13. The method of claim 12, wherein the plurality of independent circuits and the plurality of interconnections are of the same conductive material in the first conductive layer.

* * * * *